United States Patent [19]

Bauer et al.

[11] Patent Number: 4,967,255
[45] Date of Patent: Oct. 30, 1990

[54] CONTROLLABLE POWER SEMICONDUCTOR COMPONENT

[75] Inventors: Friedhelm Bauer, Würenlingen; Horst Grüning, Baden, both of Switzerland

[73] Assignee: Asea Brown Boveri Ltd., Baden, Switzerland

[21] Appl. No.: 396,227

[22] Filed: Aug. 21, 1989

[30] Foreign Application Priority Data

Sep. 22, 1988 [DE] Fed. Rep. of Germany ....... 3832208

[51] Int. Cl.$^5$ .................. H01L 29/00; H01L 29/10; H01L 29/06; H01L 27/02
[52] U.S. Cl. .................. 357/37; 357/23.4; 357/20; 357/38; 357/43
[58] Field of Search .............. 357/23.4, 20, 37, 38, 357/43, 55, 13 PT, 13 U

[56] References Cited

U.S. PATENT DOCUMENTS

| 4,639,761 | 1/1987 | Singer et al. | 357/37 X |
| 4,760,431 | 7/1988 | Nakagawa et al. | 357/43 X |

FOREIGN PATENT DOCUMENTS

| 0017980 | 10/1980 | European Pat. Off. . |
| 0074133 | 3/1983 | European Pat. Off. . |
| 0164292 | 12/1985 | European Pat. Off. . |
| 0200863 | 12/1986 | European Pat. Off. . |
| 0219995 | 4/1987 | European Pat. Off. . |
| 0241662 | 10/1987 | European Pat. Off. . |
| 3117202 | 11/1982 | Fed. Rep. of Germany . |
| 3733100 | 4/1988 | Fed. Rep. of Germany . |

OTHER PUBLICATIONS

Temple, Victor A. K.: MOS-Controlled Thyristors-A New Class of Power Devices. In: IEEE Transactions Electron Devices, vol. ED-33, No. 10, Oct. 1986, S. 1609-1618.

Zekry A. and Gerlach W.: Reduction of the Current Gain of the n-p-n Transistor Component of a Thyristor Due to the Doping Concentration of the p-Base. In: IEEE Transactions on Electron Devices, vol. 35, No. 3, Mar. 1988, S. 365-372.

Primary Examiner—Rolf Hille
Assistant Examiner—F. Abraham
Attorney, Agent, or Firm—Oblon, Spivak, McClelland, Maier & Neustadt

[57] ABSTRACT

In a controllable power semiconductor component having a pnpn layer sequence of p-type emitter layer (9), n-type base layer (8), p-type base layer (7) and n-type emitter layer (5) the critical increased field rise during turn-off is reduced as a result of an intermediate layer (11), which has a higher n-doping than the n-type base layer (8) and which is inserted between the n-type base layer (8) and the p-type base layer (7).

5 Claims, 2 Drawing Sheets

CONTROLLABLE POWER SEMICONDUCTOR COMPONENT

BACKGROUND OF THE INVENTION

1. Field of the Invention

The present invention relates to the field of power electronics. In particular it relates to a controllable power semiconductor component, comprising (a) an anode, a cathode and a gate;
(b) between the anode and the cathode a layer sequence of a p-type emitter layer, an n-type base layer, a p-type base layer and an n-type emitter layer; and
(c) on the side of the cathode a gate-cathode structure.

A component of this type is known as an MOS-controlled thyristor (MCT), for example, from the article by V. A. K. Temple, IEEE Transactions on Electron Devices, Vol. ED-33, No. 10 (1986), P.1609–1618, or as a gate turn-off thyristor (GTO), for example, from EP-A2-No. 0 241 662.

2. Discussion of Background

Nowadays modern power electronics demands fast semiconductor components controllable by simple means up to the highest power ranges. For low-end and medium power, hitherto power MOSFETs have proved particularly suitable owing to their large input impedance at the control electrode.

However, as is known, higher switchable powers can only be achieved with bipolar structures (power BJT, thyristors). Nevertheless, it is considered to be desirable to stick to the simple, and particularly low-power, control as is used with the power MOSFETs.

The positive aspects of the bipolar and MOS structures were first combined in the form of the IGBT (insulated gate bipolar transistor). The result of this combination was, as expected, components of the 1 kV class with substantially smaller forward resistances than the comparable power MOSFETs.

On the other hand, with IGBTs the inherent flooding, common to all bipolar components, of high-resistance area of the component is noticeable; of necessity they do not reach the high switching speeds of the corresponding unipolar components.

Today, controllable semiconductor components for the highest powers are the GTO (gate turn-off) thyristors. In principle, the entire chip surface is divided here too into a number of elementary cells connected in parallel. These components can be turned on and off via the gate contact; in this arrangement, however, an enormous outlay in terms of circuitry must be taken into account for the gate control.

A promising remedy here is MOS technology: various structures for such MCTs (MOS-controlled thyristors) can be specified, which all have cathode-side short-circuits switchable via MOS gates.

It has already been demonstrated in experiments that this principle permits current densities of more than 1000 Acm$^{-2}$ to be turned off. With these MCTs, too, the structure of the cathode is similar to that of power MOSFETs and IGBTs. Thus, the elementary cells also have comparable dimensions (typical values are 20–30 μm). If a larger component (e.g. on a 4" wafer) is to be realized, problems rapidly arise with the production yield. Nevertheless, the MCT is currently one of the most interesting candidates for future power semiconductor components.

It is currently usual to eliminate the inherent instabilities of the thyristors during dynamic operation by external connection to passive components. This connection limits the rate of rise of the anode voltage (dV/dt) to the values to be adhered to for safe turn-off.

In the case of thyristors of the GTO type, extremely non-homogeneous current density distributions (filaments) can occur during the turn-off. The current then concentrates essentially on one cathode element and can lead rapidly to the destruction of the thyristor as a result of thermal overloading. This effect must therefore be taken into account by a special design of the component, as well as by suitable protective circuits.

In general, two prerequisites must be fulfilled in a physical system to permit the formation of filaments: firstly the system must have a positive feedback. In the case of thyristors this is automatically provided by the pnpn structure. The second prerequisite is the existence of fluctuations of one or more physical quantities.

Known and already described in this context is, for example, the current concentration under the comparatively wide control segments in the conventional GTO. It is produced by the limited shunt conductance of the p-base; this triggering mechanism does not occur in finely structured elements such as the MCT.

However, the deduction should not be made from this that the MCT could turn off filament-free. According to the current state of knowledge, it is thought that in the MCT the phenomenon of "dynamic avalanche" is a trigger for the filamentation during the turn-off (see, for example,: M. Stoisiek et al., IEEE International Electron Devices Meeting Techn. Dig. (1987), p.666–669).

During the turn-off, a finely structured component such as the MCT runs through time sections in which there are still considerable currents flowing from the p-type base layer to the n-type base layer with a space-charge zone already building up at the p-n junction. Due to the rapidly growing electrical field, holes now drift from the still flooded n-base with drift saturation speed through the space-charge zone to the cathode.

The density of these holes, which depends only on the external current, greatly influences the field-strength distribution over the space-charge zone. Owing to their positive charge, the holes create an effective increase of the doping of the n-type base layer, which is expressed in a field rise at the p-n junction from the p-type base layer to the n-type base layer. Depending on the amount of external current, this amount can become so large that the breakdown field strength valid under static conditions is exceeded. The term "dynamic avalanche" refers to just such an increased field rise through free holes as well as to the premature breakdown.

The increased field rise created by drifting holes can only be significant in cases where the n-type base substrate doping is approximately equal to or is even less than the hole concentration. Thus, under the conditions of drift saturation, a current density of approximately 100 Acm$^{-2}$ is carried by a hole density of $6*10^{13}$ cm$^{-3}$. This value indeed approaches the substrate dopings of $1*10^{13}$ cm$^{-3}$ to $1*10^{14}$ cm$^{-3}$ typical for thyristors and automatically leads to a great increased field rise during turn-off.

SUMMARY OF THE INVENTION

Accordingly, one object of this invention is to provide a novel controllable power semiconductor component in which this increased field rise is considerably reduced.

The object is achieved in a component of the type mentioned at the beginning in that (d) an n-doped intermediate layer is arranged between the n-type base layer and the p-type base layer; and
(e) the doping concentration in the intermediate layer is higher than in the n-type base layer.

According to a first preferred exemplary embodiment of the invention, the component has the structure of an MOS-controlled thyristor (MCT).

A second preferred exemplary embodiment is defined in that the doping concentration in the n-type base layer lies approximately between $1*10^{13}$ cm$^{-3}$ and $1*10^{14}$ cm$^{-3}$ and in the intermediate layer lies approximately between $2*10^{14}$ cm$^{-3}$ and $8*10^{14}$ cm$^{-3}$.

According to a further preferred exemplary embodiment, the intermediate layer has a thickness of between 10 μm and 20 μm.

Further exemplary embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The invention will be explained below using the example of the MCT; it may be employed however in the same manner for conventional thyristors.

Figure 1:
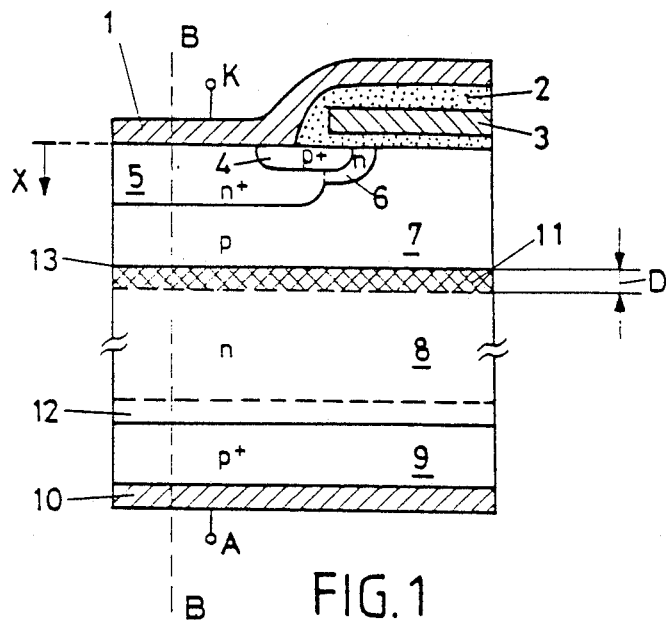
FIG. 1 shows a section of the cross-section through the standard cell of an MCT with the intermediate layer according to the invention.

Referring now to the drawings, wherein like reference numerals designate identical or corresponding parts throughout the several views, FIG. 1 shows first of all the part of the typical standard cell of an MCT in cross-section. Between an anode A and a cathode K with a corresponding anode contact 10 and cathode contact 1 there is arranged a layer sequence of a p$^+$-doped p-type emitter layer 9, an n-doped n-type base layer 8, a p-doped p-type base layer 7 and an n$^+$-doped n-type emitter layer 5. The n-type base layer 8 and the p-type base layer 7 form a p-n junction 13.

In a given region the p-type base layer 7 comes to the surface of the semiconductor substrate and there forms an MOS-controlled short-circuit together with an n-doped channel region 6, a p$^+$-doped source region 4 and superjacent gate electrode 3 separated from this substrate by a gate insulation 2. The details of the mode of operation of this arrangement can be found in the aforementioned article of V. A. Temple.

According to the invention, this thyristor structure known per se is now extended on the cathode side between the n-type base layer 8 and the p-type base layer 7 by an intermediate layer 11, having a higher n-doping than the n-type base layer 8.

The maximum values of the doping concentration in the intermediate layer 11 preferably lie here approximately in the range from $2*10^{14}$ cm$^{-3}$ to $8*10^{14}$ cm$^{-3}$.

The intermediate layer has furthermore preferably a thickness D in the range between 10 and 20 μm.

Moreover, it is advantageous to insert a higher n-doped buffer layer 12 between the n-type base layer 8 and the p-type emitter layer 9.

Figure 2:
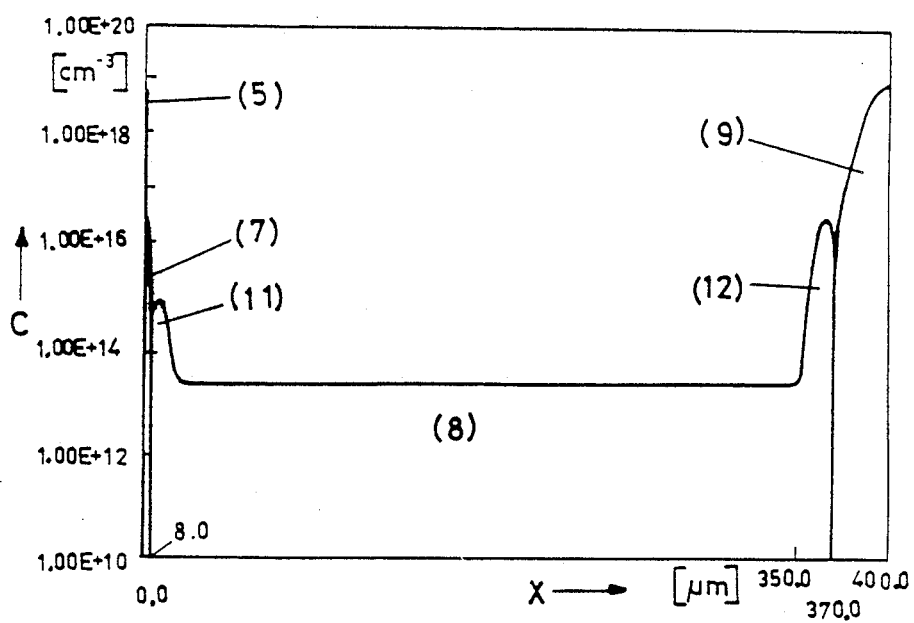
FIG. 2 shows an exemplary doping profile c(x) for an MCT according to the invention.

FIG. 2 shows on a logarithmic scale a typical distribution of the doping concentration c along the section line B—B drawn in FIG. 1 as a function of the depth x defined there. The substrate doping or the doping of the n-type base layer 8 is here $2*10^{13}$ cm$^{-3}$.

The increased field rise during first turn-off is drastically reduced as a result of the intermediate layer 11 according to the invention. In order to explain this more fully, at this point first of all a dimension similar to a "figure of merit" will be defined which permits evaluation of the proposed structures with reference to the increased field rise.

For this purpose, a quotient is formed which will be termed the field increase factor m. This dimensionless number is the ratio of the maximum electric field strength in the presence of drifting holes to the maximum field strength in the static case (no current flowing across the p-n junction).

The above-defined field increase factor m is now observed as a function of the junction voltage $V_j$ across the p-n junction 13 (FIGS. 3A, B) for a structure with the doping material profile from FIG. 2 (maximum doping of the intermediate layer 11: $8*10^{14}$ cm$^{-3}$) as well as for a further doping material profile which is not shown, but which is analogous to FIG. 2 (maximum doping of the intermediate layer 11: $5*10^{14}$ cm$^{-3}$), and finally for a conventional structure without intermediate layer (constant doping of the n-type base layer: $2*10^{13}$ cm$^{-3}$).

Figure 3B:
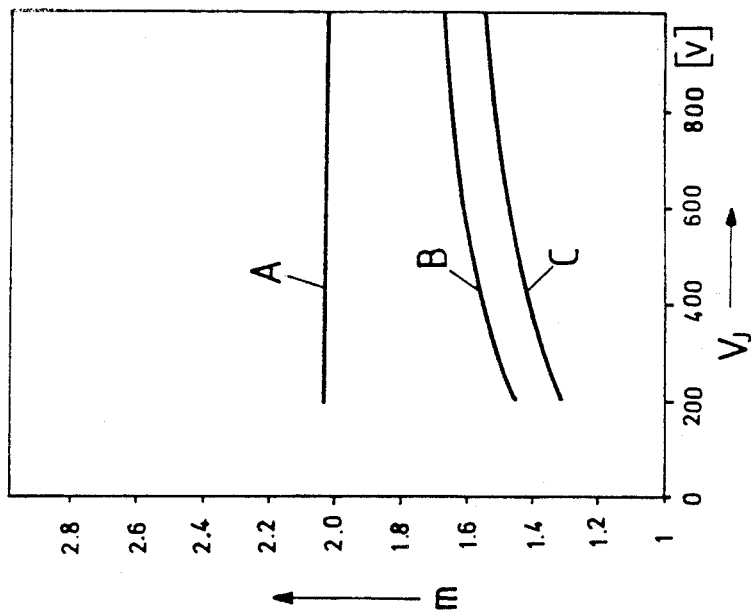
FIGS. 3A,B show the dependence of the field increase factor m on the junction voltage $V_j$ calculated in various ways.
Figure 3A:
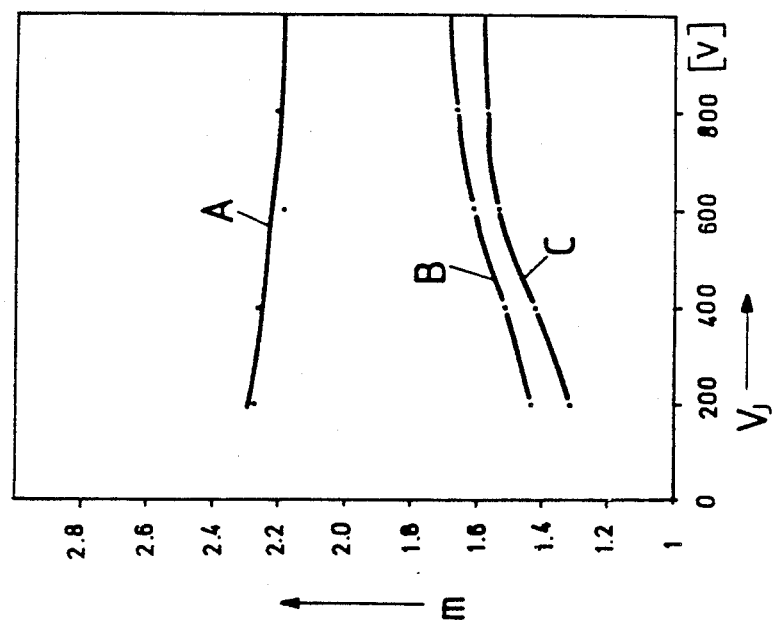

The curves A, B and C illustrated in FIG. 3A (a hole current density of 100 Acm$^{-2}$ was assumed here) were obtained from simulations with the one-dimensional device simulation program COMPASS. For the conventional structure (Curve A) a value of about 2.2 is obtained for the field increase factor m, which in a first approach is independent of the junction voltage applied. The relative increase of the electric field is therefore 120%.

As a result of the insertion of the intermediate layer 11 according to the invention (curves B and C; max. doping for curve B: $5*10^{14}$ cm$^{-3}$; maximum doping for curve C: $8*10^{14}$ cm$^{-3}$), the field increase factor m can be limited to values of 1.3 (V=200V) to 1.5 (V=1000V). FIG. 3 shows for the same structures comparable curves which were obtained from an analytical observation.

The insertion of the intermediate layer 11 naturally leads to a reduction of the static breakdown voltage of the p-n junction 13. With careful dimensioning of the doping and the thickness of the intermediate layer (as has already taken place in the above examples), the reduction of the breakdown voltage is, however, perfectly tolerable.

From calculations with the aid of the aforementioned numeric simulation program COMPASS, it emerged that the achievable breakdown voltage is lower as a result of the insertion of the more highly doped intermediate layer than the ideal breakdown voltage of the thyristor with a homogeneously doped n-base. For a doping in the n-type base layer of $1*10^{14}$ cm$^{-3}$ and a thickness D of the intermediate layer of 15 μm, for various maximum dopings of the intermediate layer the following breakdown voltages, for example, emerged (in % of the breakdown voltage without intermediate layer):

$3*10^{14}$ cm$^{-3}$: 91.8%
  $5*10^{14}$ cm$^{-3}$: 83.9%
  $8*10^{14}$ cm$^{-3}$: 71.1%

With a doping in the n-type base layer of $2*10^{14}$ cm$^{-3}$, the analogous results are:

$3*10^{14}$ cm$^{-3}$: 97.4%
  $5*10^{14}$ cm$^{-3}$: 91.1%
  $8*10^{14}$ cm$^{-3}$: 82.3%

If a reduction of about 20% is accepted, it is possible for maximum dopings of $5*10^{14}$ to $8*10^{14}$ cm$^{-3}$ to be realized, based on the thickness of the intermediate layer of 15 μm assumed here. Finally, it should also be pointed out that naturally a reduction of the ideal breakdown voltage by typically 10 to 30% is unavoidable already due to the edge termination of the component, so that the reduction as a result of the increased doping of the n-base is hardly significant anymore.

The objective of the invention is primarily to prevent the premature dynamic breakdown in MCTs owing to filamentation. Owing to the very thin p-type base layer of these components compared to conventional thyristors, the proposed intermediate layer can be created here particularly simply by an implantation or diffusion step (phosphor) with subsequent annealing.

This step is prior to the execution of the individual dopings for producing the p-type base layer, n-type emitter layer and source region. For creating the intermediate layer in thyristors with a thicker p-type base layer, the simple diffusion technique is excluded. Epitaxial growth of doped layer is a further alternative method for producing the desired layers. Using epitaxy, the principle of the invention can also be employed for conventional thyristors.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. Controllable power semiconductor component, comprising
    (a) an anode (A), a cathode (K) and a gate;
    (b) between the anode (A) and the cathode (K) a layer sequence of a p-type emitter layer (9), an n-type base layer (8), a p-type base layer (7) and an n-type emitter layer (5); and
    (c) on the side of the cathode (K) a gate-cathode structure;
  wherein
    (d) an n-doped intermediate layer (11) is arranged between the n-type base layer (8) and the p-type base layer (7); and
    (e) the doping concentration (c) in the intermediate layer (11) is higher than in the n-type base layer (8).

2. A turn-off power semiconductor component as claimed in claim 1, wherein the component has the structure of an MOS-controlled thyristor (MCT).

3. A turn-off power semiconductor component as claimed in claim 1, wherein the doping concentration (c) in the n-type base layer (8) lies approximately between $1*10^{13}$ cm$^{-3}$ and $1*10^{14}$ cm$^{-3}$ and in the intermediate layer (11) lies approximately between $2*10^{14}$ cm$^{-3}$ and $8*10^{14}$ cm$^{-3}$.

4. A turn-off power semiconductor component as claimed in claim 3, wherein the intermediate layer (11) has a thickness (D) of between 10 μm and 20 μm.

5. A turn-off power semiconductor component as claimed in claim 4, wherein there is arranged between the n-type base layer (8) and the p-type emitter layer (9) an n-type buffer layer (12) which has a higher doping compared to the n-type base layer (8).

* * * * *